United States Patent [19]

Hall

[11] Patent Number: 5,021,858

[45] Date of Patent: Jun. 4, 1991

[54] COMPOUND MODULATED INTEGRATED TRANSISTOR STRUCTURE

[76] Inventor: John H. Hall, 3169 Payne, Apt. #50, San Jose, Calif. 95117

[21] Appl. No.: 528,950

[22] Filed: May 25, 1990

[51] Int. Cl.⁵ ............................................. H01L 27/02
[52] U.S. Cl. ........................................ 357/42; 357/41; 357/34; 357/43
[58] Field of Search ...................... 357/42, 43, 34, 41

[56] References Cited

U.S. PATENT DOCUMENTS

| | | | |
|---|---|---|---|
| 4,672,584 | 6/1987 | Tsuji et al. | 357/42 |
| 4,859,624 | 8/1989 | Goto | 357/42 |
| 4,920,399 | 4/1990 | Hall | 357/42 |

FOREIGN PATENT DOCUMENTS

| | | | |
|---|---|---|---|
| 53-084485 | 7/1978 | Japan | 357/42 |
| 60-160651 | 8/1985 | Japan | 357/42 |
| 52-291165 | 12/1987 | Japan | 357/42 |
| 63-252464 | 11/1988 | Japan | 357/42 |
| 63-304660 | 12/1988 | Japan | 357/42 |
| 1-225155 | 9/1989 | Japan | 357/42 |

*Primary Examiner*—Jerome Jackson, Jr.
*Assistant Examiner*—Dang Xuan Hung
*Attorney, Agent, or Firm*—Henry K. Woodward

[57] ABSTRACT

Disclosed is an integrated transistor structure having increased conductance and operating speed including a complementary insulated gate field-effect transistor pair, each including a source and drain region with a gate contact positioned therebetween, ohmic contacts to the source and drain regions, and a p-n junction contact to each of the drain regions. The gates of the two transistors are interconnected and function as the input terminal, and the two p-n junction contacts are interconnected as the output of the device. The operation of the device is such that the lightly-doped drain regions act as bases of bipolar transistors, with the emitters formed by the p-n junction diodes. Minority carriers injected by the diodes modulate the channel regions, thereby lowering their resistivity and increasing the transconductance of the device without increasing the physical size or the capacitance of the device and thereby improving the speed of the device. The ohmic contacts to the drain regions are interconnected, and the low on resistance of the opposite polarity drive transistor extracts any excess stored charge in the drain region.

5 Claims, 1 Drawing Sheet

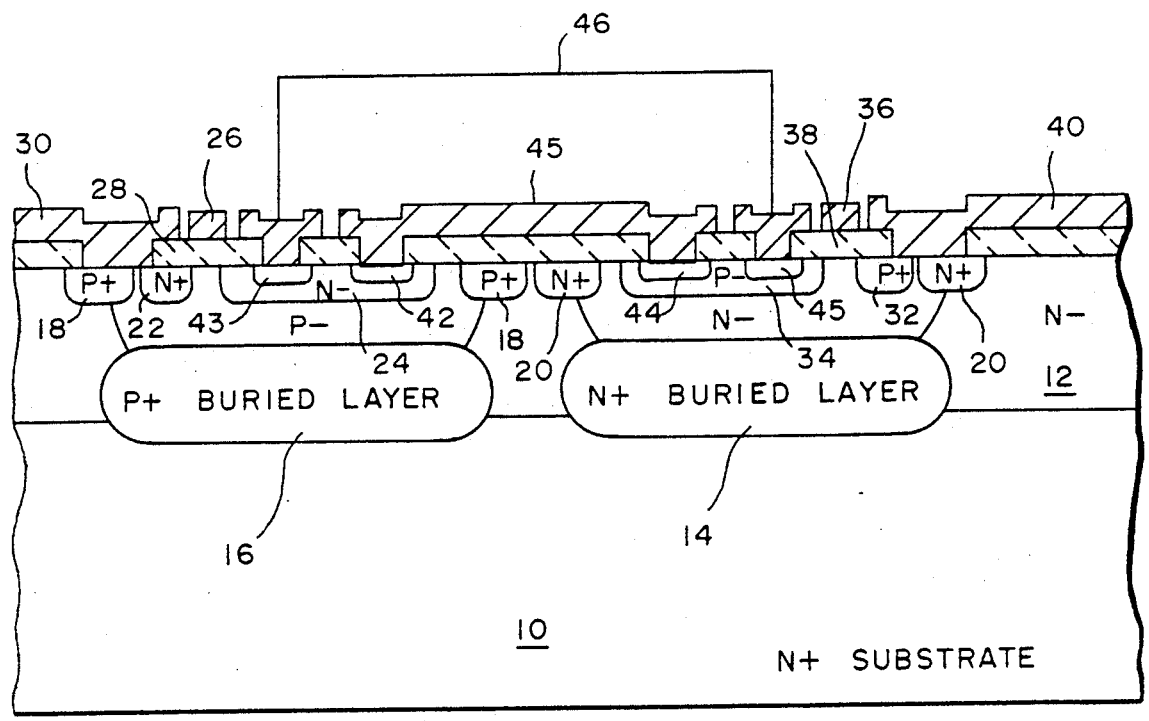
FIG.—1
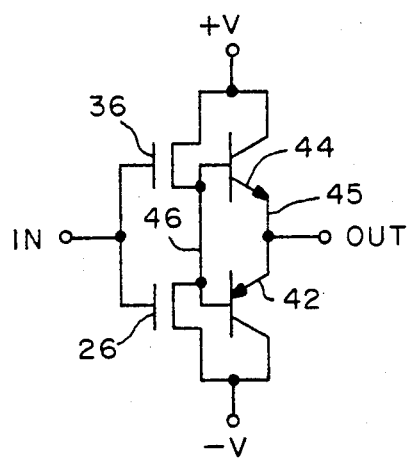
FIG.—2

COMPOUND MODULATED INTEGRATED TRANSISTOR STRUCTURE

This application is related to U.S. Pat. No. 4,920,399 issued Apr. 24, 1990 Ser. No. 418,962 filed Oct. 10, 1989 for "Conductance-Modulated Integrated Transistor Structure." This application is related to applicant's co-pending U.S. patent application Ser. No. 07/500,227, filed Mar. 27, 1990 for "Compound Modulated Integrated Transistor Structure", a continuation of U.S. patent application Ser. No. 07/053,303 filed May 22, 1987, now abandoned.

Background of the Invention

This invention relates generally to semiconductor devices, and more particularly the invention relates to an integrated transistor logic device utilizing a compound transistor formed from a CMOS transistor operating in conjunction with a bipolar transistor formed within its drain region to increase transconductance and switching speed.

The CMOS transistor pair is widely used in integrated circuit logic applications. However, a limitation of such devices is speed of operation. The present invention is directed to modifying a CMOS transistor structure to include a region of opposite polarity within the drain region, which acts as a minority carrier injector. The drain region forms the base region, the injector region forms the emitter and the buried layer forms the collector of the bipolar transistor. The resulting structure has a much higher transconductance with no increase in input capacitance, resulting in an increase in operating speed.

The use of Schottky injection in double-diffused MOS transistors (DMOS) is disclosed by Ng et al. in "P-channel Schottky Injection Field Effect Transistors," IEDM 1987, pp. 770–773. As described therein the high on resistance associated with p-channel DMOS transistors generally limits their current-handling capability. By using a p-n junction to inject a large amount of minority carrier into the drift region, very low on resistance can be achieved at the expense of slower switching speed.

SUMMARY OF THE INVENTION

An object of the invention is an integrated transistor structure having improved operating speed.

Another object of the invention is an insulated gate compound transistor structure using modulated conduction to increase operating speed.

A feature of the invention is the use of an emitter diode as the drain contact structure in a complementary-pair invertor.

Briefly, in one embodiment of the invention a CMOS transistor pair is fabricated in the surface of a lightly-doped (on the order of 10 to the 12 atoms per cubic centimeter) semiconductor body such as an epitaxial layer formed on a supporting substrate. The drain region of each transistor is lightly doped (on the order of 10 to the 16 atoms per cubic centimeter) and a junction diode contact is made thereto adjacent the drain contact. The resistivity of the drain region is sufficiently high to allow formation of an emitter electrode contact to the drain region by the more heavily doped region. The common gate terminals function as the device input, and the common injecting electrodes function as the device output.

In operation, the drains of the transistors are connected together and form the bases of bipolar transistors with the injecting diodes functioning as emitter followers. The diodes inject minority carriers when the MOS gates are turned on and cause a significant reduction in output resistance. The use of an auxiliary p-n junction injector in conjunction with each transistor of a Complementary MOS transistor pair, while retaining the connection between the two drains, overcomes the problem of slow switching speed observed in the application of the p-n junction minority carrier injector to the DMOS transistor. A p-n junction is formed within the drain area of each of the p-channel transistor and the n-channel transistor forming a complementary bipolar transistor output stage formed in conjunction with the complementary MOS input. The drain contact of the transistor is formed in the usual way, but is electrically connected only to the drain contact of the opposite polarity transistor. The p-n junction emitter of the p-channel MOS transistor is electrically connected to the p-n junction emitter of the n-channel transistor through a metal interconnect and forms the output terminal of the device. The gate electrodes of the MOS transistors are connected and form the invertor input. In this configuration the drains of the MOS transistors form the base of each of two complementary (Emitter followers) auxiliary emitter bipolar transistors. The p-n junction (formed completely within the drain area and spaced the required base width from the bottom of the drain p-n junction) is of higher carrier concentration than the drain and forms the emitter of the bipolar transistor. The collector of the bipolar transistor is formed by a buried layer underneath the MOS transistor, which is of the opposite polarity to the drain and is connected to the appropriate power terminal. The bi-directional base currents of this pair of complementary bipolar transistors are supplied via the channels of the respective MOS transistors when their gates are turned on and off, increasing switching speed by providing for rapid removal of any excess charge in the bipolar transistors.

The invention and objects and features thereof will be more readily apparent from the following detailed description and appended claims when taken with the drawing.

BRIEF DESCRIPTION OF THE DRAWING

FIG. 1 is a section view of a complementary MOS transistor pair fabricated in accordance with the present invention.

FIG. 2 is a schematic diagram of the integrated transistor structure of FIG. 1.

DETAILED DESCRIPTION OF ILLUSTRATIVE EMBODIMENTS

Referring now to the drawing, FIG. 1 is a section view illustrating an integrated transistor structure in accordance with one embodiment of the invention. In this embodiment, an n+ substrate 10 has an n− epitaxial layer 12 formed thereon. The dopant concentration of the epitaxial layer is very light, on the order of $10^{12}$ atoms per cubic centimeter. An n+ buried layer 14 and a p+ buried layer 16 are provided at the interface of the epitaxial layer 12 and substrate 10. Conventionally, the buried layer is formed by highly doped surface regions of the substrate 10 prior to the epitaxial growth of layer 12. The portion of the n− epitaxial layer 12 above the p+ buried layer 16 is converted to p− conductivity by ion implantation. P+ regions 18 are formed at the surface of epitaxial layer 12 and define a device region above the p+ buried layer 16, and n+ regions 20 are formed in the surface of the epitaxial layer 12 of the n+ buried layer region 14 and define a second device region.

An n− channel insulated-gate transistor is formed in the first device region with an n+ source region 22 formed in the surface and a lighter-doped n− region 24 (e.g. $10^{16}$ atoms/cc) spaced from the n− region 22 and defining the drain region. A gate contact 26 is formed over an insulated layer 28 between the source 22 and drain 24. A first metallization 30 interconnects the source 22 to a −V contact.

Similarly, a p-channel insulated-gate transistor is fabricated in the second device region above the $n^{30}$ buried layer 14 with a p+ region 32 forming the source and a lighter-doped p− region 34 (e.g. $10^{16}$ atoms/cc) forming the drain. A gate contact 36 is formed over an insulating layer 38 between the source 32 and drain 34. Metallization 40 connects the source 32 with a +V contact.

In accordance with the invention, diffused regions 42 and 44 are made in the n− drain 24 and to the p− drain 34, respectively, of the two transistors. The regions 42 and 44 function as emitters and form junction diodes with the drain regions, and the drain regions function as base regions in complementary bipolar transistors. Metal layer 45 interconnects regions 42 and 44 and functions as the output of the circuit. Ohmic contacts 43 and 45 are made to the base regions 24 and 34 which are interconnected by a conductor 46. The buried regions 14 and 16 form the collectors of the bipolar transistors.

FIG. 2 is an electrical schematic of the structure in which the input is applied to the common terminal of the gates 26 and 36 of the two field-effect transistors, and the output is taken at the common connection of the emitter contacts 42, 44 of the two bipolar transistors. The diodes inject minority carriers when the MOS gates are turned on and cause a significant reduction in output resistance. The interconnection of the base regions and the low on resistance of the opposite polarity drive transistor extracts any excess stored charge, thereby providing a much higher transconductance with no increase in input capacitance and resulting in an increase in operating speed.

In an alternative embodiment, the emitter regions could be enhanced by using polycrystalline silicon in the emitter regions, which is doped with the implants. This gives higher beta, which in general are not needed and may cause latchup in the diffused isolated version. The big improvement in speed is due to the transistor base connection. Where the MOS FET drains are both connected to the bases, the excess stored charge, if there is any, is extracted by the low on resistance of the opposite polarity drive transistor.

There has been described an integrated transistor logic device in which use of auxiliary p-n junction injectors in conjunction with each transistor of a complementary MOS transistor pair while retaining the connection between drains, overcomes the problem of slow switching speed. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

I claim:

1. An integrated transistor structure comprising
   a semiconductor body having a major surface with a first device region of a first conductivity type and a second device region of a second conductivity type therein,
   a first device formed in said first device region and including a source region and a drain region of said second conductivity type, said source and drain regions being spaced apart by a channel region, a gate contact between said source and drain regions and insulatively spaced from said first device region, an ohmic contact to said source region, an ohmic contact to said drain region, and a rectifying contact region of first conductivity type in said drain region",
   a second device formed in said second device region and including a source region and a drain region of first conductivity type, said source and drain regions being spaced apart by a channel region, a gate contact between said source and drain regions and insulatively spaced from said second device region, an ohmic contact to said source region an ohmic contact to said drain region, and a rectifying contact region of second conductivity type in said drain region",
   input connector means interconnecting said gate of said first device and said gate of said second device,
   output connector means interconnecting said rectifying contact regions of said first and second devices, and
   means interconnecting said ohmic contacts to said drain regions.

2. The integrated transistor structure as defined by claim 1 wherein said semiconductor body comprises a semiconductor substrate and an epitaxial layer formed on a surface of said substrate.

3. The integrated transistor structure as defined by claim 2 wherein said first device further includes a first buried layer of said first conductivity type, and said second device further includes a second buried layer of said second conductivity type.

4. The integrated transistor structure as defined by claim 3 wherein dopant concentration in said drain regions is sufficiently low to enable rectifying contacts thereto.

5. The integrated transistor structure as defined by claim 1 wherein said rectifying contact regions in said drain regions comprise doped polycrystalline silicon.

* * * * *